(12) United States Patent
Liu et al.

(10) Patent No.: US 11,953,379 B2
(45) Date of Patent: Apr. 9, 2024

(54) LIVE DETECTION SYSTEM, METHOD, AND THERMAL INFRARED IMAGER FOR POWER GRID EQUIPMENT

(71) Applicants: State Grid Shandong Electric Power Research Institute, Shandong (CN); State Grid Corporation of China, Beijing (CN)

(72) Inventors: Rong Liu, Shandong (CN); Hui Liu, Shandong (CN); Qinghe Shen, Shandong (CN); Jinxia Yao, Shandong (CN); Haiyan Yuan, Shandong (CN); Bo Yang, Shandong (CN); Xiaobin Sun, Shandong (CN); Chao Gu, Shandong (CN); Ran Jia, Shandong (CN); Yang Zhang, Shandong (CN); Chao Zhou, Shandong (CN); Chuanbin Liu, Shandong (CN)

(73) Assignees: State Grid Shandong Electric Power Research Institute, Jinan (CN); State Grid Corporation of China, Beijing (CN)

( * ) Notice: Subject to any disclaimer, the term of this patent is extended or adjusted under 35 U.S.C. 154(b) by 633 days.

(21) Appl. No.: 17/110,317

(22) Filed: Dec. 3, 2020

(65) Prior Publication Data
US 2021/0096028 A1 Apr. 1, 2021

Related U.S. Application Data

(63) Continuation-in-part of application No. PCT/CN2020/101171, filed on Jul. 10, 2020.

(30) Foreign Application Priority Data
Sep. 30, 2019 (CN) .......................... 201910951830.5

(51) Int. Cl.
*G01J 5/00* (2022.01)
*G01R 31/12* (2020.01)

(52) U.S. Cl.
CPC ........ *G01J 5/0096* (2013.01); *G01R 31/1218* (2013.01); *G01J 2005/0077* (2013.01)

(58) Field of Classification Search
CPC .. G01J 5/0096; G01J 2005/0077; G01J 5/068; G01J 5/80; G01R 31/1218
See application file for complete search history.

(56) References Cited

U.S. PATENT DOCUMENTS

| 2018/0330143 A1* | 11/2018 | Ramirez | ................. G06T 7/11 |
| 2023/0014408 A1* | 1/2023 | Johnson | ................. G01J 5/70 |

FOREIGN PATENT DOCUMENTS

| CN | 103901072 A | * | 7/2014 |
| CN | 103901072 A | | 7/2014 |

(Continued)

*Primary Examiner* — Brandi N Hopkins
*Assistant Examiner* — Janice M Soto

(57) ABSTRACT

A live detection system, a thermal infrared (IR) imager and a method for power grid equipment are provided. The system includes an environmental parameter module for acquiring environmental temperature, humidity and wind speed data; a ranging module for measuring a linear distance to the power grid equipment; an equipment type recognition module for acquiring an image of the power grid equipment, and recognizing a type of the power grid equipment; an equipment material determination module for determining a material type of the power grid equipment; an emissivity setting module for setting an emissivity; an temperature measurement module for obtaining a temperature of the power grid equipment by focusing on positions of the power grid equipment which need temperature measurement; and a report generation module for selecting a corresponding diagnostic model, displaying a temperature measurement (Continued)

position and a temperature value, drawing a conclusion, and generating a report.

10 Claims, 3 Drawing Sheets

(56) References Cited

FOREIGN PATENT DOCUMENTS

| CN | 203981276 | U | * | 12/2014 | |
| CN | 203981276 | U | | 12/2014 | |
| CN | 104833428 | A | * | 8/2015 | |
| CN | 104833428 | A | | 8/2015 | |
| CN | 105157847 | A | * | 12/2015 | |
| CN | 105157847 | A | | 12/2015 | |
| CN | 107764405 | A | * | 3/2018 | ............... G01J 5/00 |
| CN | 107764405 | A | | 3/2018 | |
| CN | 207114031 | U | | 3/2018 | |

* cited by examiner

LIVE DETECTION SYSTEM, METHOD, AND THERMAL INFRARED IMAGER FOR POWER GRID EQUIPMENT

CROSS REFERENCE TO RELATED APPLICATIONS

The present application is a Continuation-In-Part Application of PCT Application No. PCT/CN2020/101171 filed on Jul. 10, 2020, which claims the benefit of Chinese Patent Application No. 201910951830.5 filed on Sep. 30, 2019. All the above are hereby incorporated by reference in their entirety.

TECHNICAL FIELD

The present invention relates to a live detection system, method, and thermal infrared (IR) imager for power grid equipment, and belongs to the technical field of live detection of power grid equipment.

BACKGROUND

As a mature live detection technology, infrared (IR) temperature measurement has been widely used in the IR diagnosis of power grid equipment. IR temperature measuring instruments include thermal IR imager and point-and-shoot IR thermometer. The thermal IR imager has a better effect and is more extensively used. It obtains the temperature distribution and data of the entire temperature surface through fast scanning detection. With the continuous progress of product research and development, the image clarity and intelligence of the thermal IR imager are constantly improved. A thermal IR imager system with intelligent interconnection (ZL201720544807.0) can transmit temperature data to an application (APP) module on the smart tablet computer via universal serial bus (USB) or wireless fidelity (WIFI) for display.

The environment (temperature, humidity, wind speed, etc.) of the power grid equipment must meet the requirements of relevant standards for IR detection. Therefore, in addition to the thermal imager, the detection personnel needs to carry equipment such as thermometer, hygrometer and anemometer. Since the distance between the thermal imager and the power grid equipment will affect the temperature measurement result, the detection personnel also needs to carry a rangefinder. The power grid equipment is made of various materials, such as metal, silicon rubber and ceramics. The detection personnel needs to set the emissivity of the detection equipment according to the type of the equipment material. The temperature, detection distance, emissivity and other parameters need to be manually input into the parameter settings of the thermal imager to ensure the accuracy of temperature measurement. The determination methods and criteria of IR diagnosis for different types of equipment are varying. The IR diagnosis requires on-site reading of the temperature value of the corresponding part of the equipment or importing the measured image into a computer for analysis, which requires professional personnel to operate. In particular, high-precision IR temperature measurement has high requirements on the professional level of the detection personnel, and the operation is cumbersome.

At present, the widely used thermal imagers do not have the functions of automatic parameter setting and automatic generation of detection conclusions, and their automation and intelligence levels still need to be improved.

SUMMARY

In order to overcome the above shortcomings in the prior art, the present invention proposes a live detection system, thermal infrared (IR) imager and method for power grid equipment. The present invention can intelligently recognize the power grid equipment, automatically measure the temperature, and generate a detection conclusion, thereby reducing the requirements for the professional level of the detection personnel.

In order to solve the technical problem, the present invention adopts the following technical solutions:

According to a first aspect, an embodiment of the present invention provides a live detection system for power grid equipment, including:

an environmental parameter module, used to acquire environmental temperature, humidity and wind speed data, and set parameters;

a ranging module, used to measure a linear distance to the power grid equipment, and set a parameter;

an equipment type recognition module, used to acquire an image of the power grid equipment, and recognize a type of the power grid equipment;

an equipment material determination module, used to determine a material type of the power grid equipment according to the recognized equipment type and an appearance characteristic of the equipment;

an emissivity setting module, used to set an emissivity according to the material type of the power grid equipment;

a temperature measurement module, used to obtain a temperature of the power grid equipment by focusing on a position of the power grid equipment which needs temperature measurement; and a report generation module, used to select a corresponding diagnostic model according to the type of the detected power grid equipment, display a temperature measurement position and a temperature value on a display screen, draw a conclusion according to a corresponding determination criterion, and generate a report.

According to a possible implementation of the present embodiment, the live detection system for power grid equipment further includes an environmental determination module, used to determine whether the acquired environmental humidity data meets a requirement of a detection environment.

According to a possible implementation of the present embodiment, the ranging module is an IR ranging module.

According to a second aspect, an embodiment of the present invention provides a live detection thermal IR imager for power grid equipment, including the live detection system for power grid equipment.

According to a possible implementation of the present embodiment, the ranging module is a ranging module that comes with the thermal IR imager to measure a linear distance d between the thermal IR imager and the power grid equipment, automatically set a detection distance, and determine whether the detection distance meets a detection requirement. The determination on whether the detection distance meets a detection requirement includes: calculating a minimum detection distance $d_{min}$ to recognize the detected equipment according to a minimum recognition length of the detected equipment and a spatial resolution of the thermal IR imager; comparing the minimum detection distance with a measured distance d; and prompting that the detection distance does not meet the detection requirement if $d>d_{min}$.

According to a possible implementation of the present embodiment, the thermal IR imager is used to intelligently recognize an equipment type, and allow manual adjustment if the recognized equipment type is inaccurate; determine a material type of the power grid equipment according to the equipment type and an appearance characteristic of the equipment, and allow manual adjustment if the recognized material type is inaccurate; set an emissivity according to the material type of the power grid equipment; select a corresponding diagnostic model according to the type of the detected equipment; automatically focus on positions of the detected equipment which need temperature measurement, read temperature measurement results, performing calculation according to a corresponding determination criterion to draw a conclusion, and generate a report.

According to a third aspect, an embodiment of the present invention provides a live detection method for power grid equipment, including following steps:

acquiring environmental temperature, humidity and wind speed, and setting environmental parameters;

determining whether an environment meets a standard environmental requirement, proceeding to the next step if yes, and ending the detection if not;

measuring a linear distance d to the equipment, and completing a detection requirement setting;

determining whether there is a need to determine whether a detection distance meets a detection requirement; determining whether the detection distance meets the detection requirement if yes, and proceeding to the next step after the detection requirement is met;

intelligently recognizing an equipment type, and allow manual adjustment if the recognized equipment type is inaccurate;

determining a material type of the power grid equipment according to the equipment type and an appearance characteristic of the equipment, and allow manual adjustment if the recognized material type is inaccurate;

setting an emissivity according to the material type of the power grid equipment;

selecting a corresponding diagnostic model according to the type of the detected equipment; and automatically focusing on positions of the detected equipment which need temperature measurement, reading temperature measurement results, performing calculation according to a corresponding determination criterion to draw a conclusion, and generating a report.

According to a possible implementation of the present embodiment, the standard environmental requirement is that a relative humidity of the environment is not greater than 85%.

According to a possible implementation of the present embodiment, the determining whether a detection distance meets a detection requirement includes: comparing the detection distance d with a minimum detection distance $d_{min}$ which allows recognition of the detected power grid equipment; if $d \le d_{min}$, determining that the detection distance meets the detection requirement; otherwise, determining that the detection distance does not meet the detection requirement, and restarting the detection after changing the detection position.

According to a possible implementation of the present embodiment, the minimum detection distance $d_{min}$ is calculated according to the following equation:

minimum detection distance $d_{min}$=target length or height/(spatial resolution×number of pixels).

According to a possible implementation of the present embodiment, after changing the detection position, ending detection if there is no suitable detection position (that is, $d>d_{min}$).

The technical solutions of the embodiments of the present invention have the following beneficial effects:

As a technical solution of the embodiment of the present invention, the live detection system for power grid equipment automatically detects environmental parameters, detection distance and other parameters, reducing the number of equipment carried by IR detection personnel. The live detection system automatically sets the parameters, intelligently recognizes the equipment, automatically measures the temperature, and generates a detection conclusion, thereby reducing the requirements for the professional level of the detection personnel.

As a technical solution of the embodiment of the present invention, the live detection thermal IR imager for power grid equipment automatically detects the environmental temperature, humidity, wind speed, and detection distance from the equipment, automatically recognizes the types of the equipment and material, determines the emissivity, and automatically sets the above parameters in the thermal imager. The thermal IR imager determines the equipment type through image recognition, automatically reads the temperature data at the corresponding position of the equipment according to an IR diagnostic standard corresponding to the equipment type, performs calculation and draws a detection conclusion. The thermal IR imager reduces the number of equipment carried by the IR detection personnel, and realizes automatic setting of detection parameters, intelligent recognition of the equipment type, and automatic generation of the detection conclusion, reducing the requirements for the professional level of the detection personnel.

As a technical solution of the embodiment of the present invention, the live detection method for power grid equipment performs IR temperature measurement on the power grid equipment. The live detection method reduces the number of equipment carried by the IR detection personnel, and realizes automatic setting of detection parameters, intelligent recognition of the equipment type, and automatic generation of the detection conclusion, reducing the requirements for the professional level of the detection personnel.

DETAILED DESCRIPTION

Figure 1:
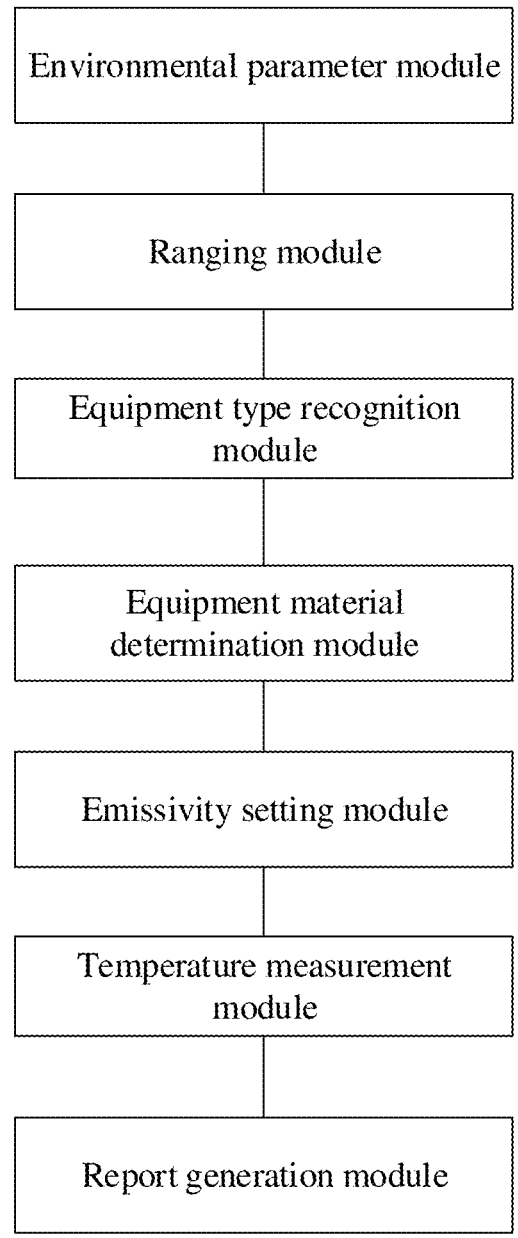
FIG. 1 is a structural diagram of a live detection system for power grid equipment according to an exemplary embodiment.

The present invention is described in more detail with reference to the accompanying drawings and embodiments.

In order to describe the technical features of the technical solutions of the present invention clearly, the present invention is described in detail below with reference to the specific implementations and accompanying drawings. The following disclosure provides many different embodiments or examples for implementing different structures of the present invention. In order to simplify the present invention, the components and settings of specific examples are described below. In addition, the present invention may repeat reference numbers and/or letters in different examples. This repetition is intended for simplification and clarity only, rather than to indicate the relationship between the various embodiments and/or settings discussed. It should be noted that the components illustrated in the drawings are not necessarily drawn to scale. The present invention omits descriptions of well-known components and processing techniques and processes to avoid unnecessarily limiting the present invention.

Embodiment 1

FIG. 1 is a flowchart of the live detection method for power grid equipment according to the exemplary embodiment. As shown in FIG. 1, the live detection system for power grid equipment according to the embodiment of the present invention includes: an environmental parameter module, a ranging module, an equipment type recognition module, an equipment material determination module, an emissivity setting module, a temperature measurement module and a report generation module.

The environmental parameter module is used to acquire environmental temperature, humidity and wind speed data, and set parameters.

The ranging module is used to measure a linear distance to the power grid equipment, and set a parameter.

The equipment type recognition module is used to acquire an image of the power grid equipment, and recognize a type of the power grid equipment.

The equipment material determination module is used to determine a material type of the power grid equipment according to the recognized equipment type and an appearance characteristic of the equipment.

The emissivity setting module is used to set an emissivity according to the material type of the power grid equipment.

The temperature measurement module is used to obtain a temperature of the power grid equipment by focusing on positions of the power grid equipment which need temperature measurement.

The report generation module is used to select a corresponding diagnostic model according to the type of the detected power grid equipment, display a temperature measurement position and a temperature value on a display screen, draw a conclusion according to a corresponding determination criterion, and generate a report.

According to a possible implementation of the present embodiment, the live detection system for power grid equipment further includes an environmental determination module, used to determine whether the acquired environmental humidity data meets a requirement of a detection environment.

According to a possible implementation of the present embodiment, the ranging module is an IR ranging module.

The live detection system in this embodiment automatically detects environmental parameters, detection distance and other parameters, reducing the number of equipment carried by IR detection personnel. The live detection system automatically sets the parameters, intelligently recognizes the equipment, automatically measures the temperature, and generates a detection conclusion, thereby reducing the requirements for the professional level of the detection personnel.

Embodiment 2

Figure 2:
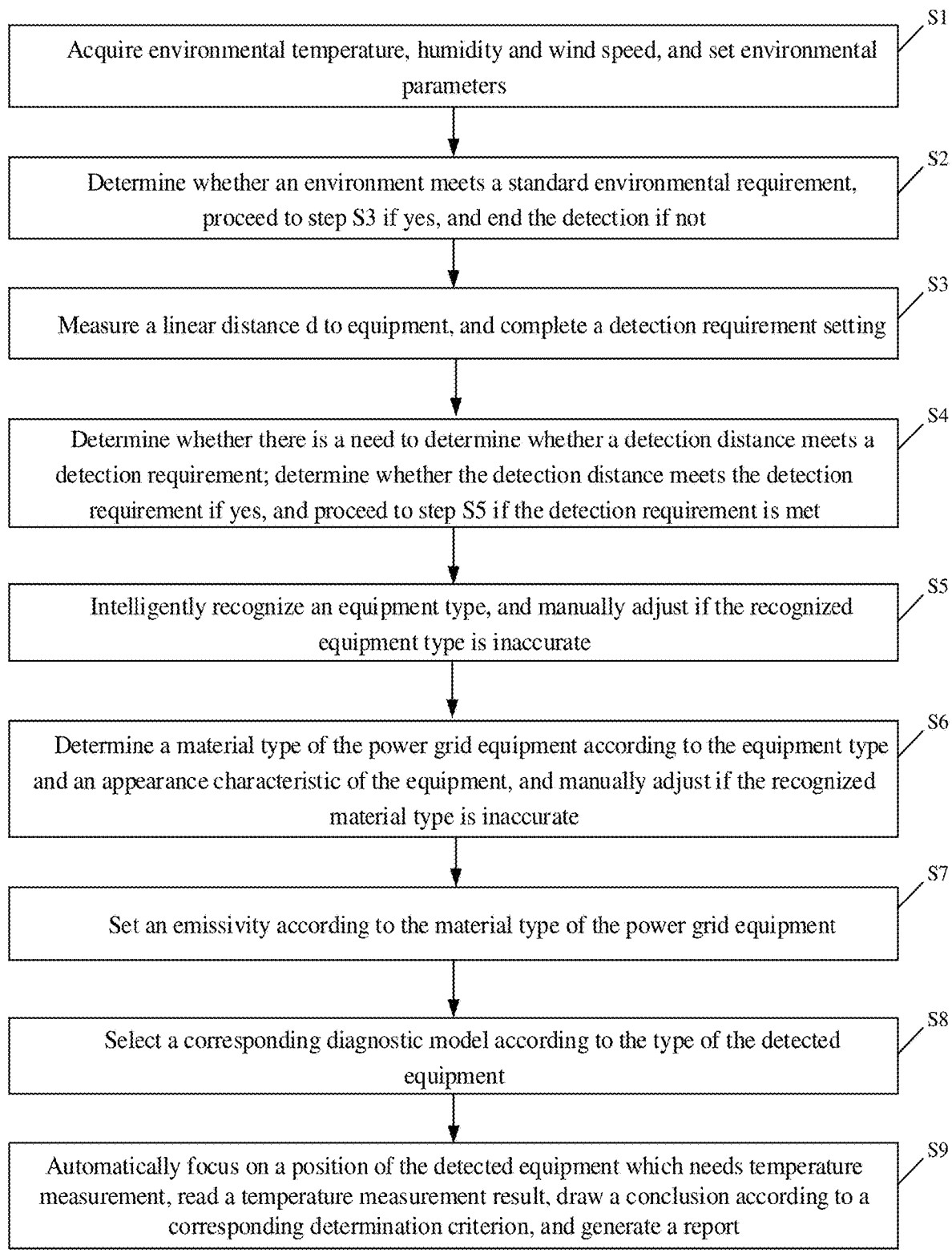
FIG. 2 is a flowchart of a live detection method for power grid equipment according to an exemplary embodiment.
Figure 3:
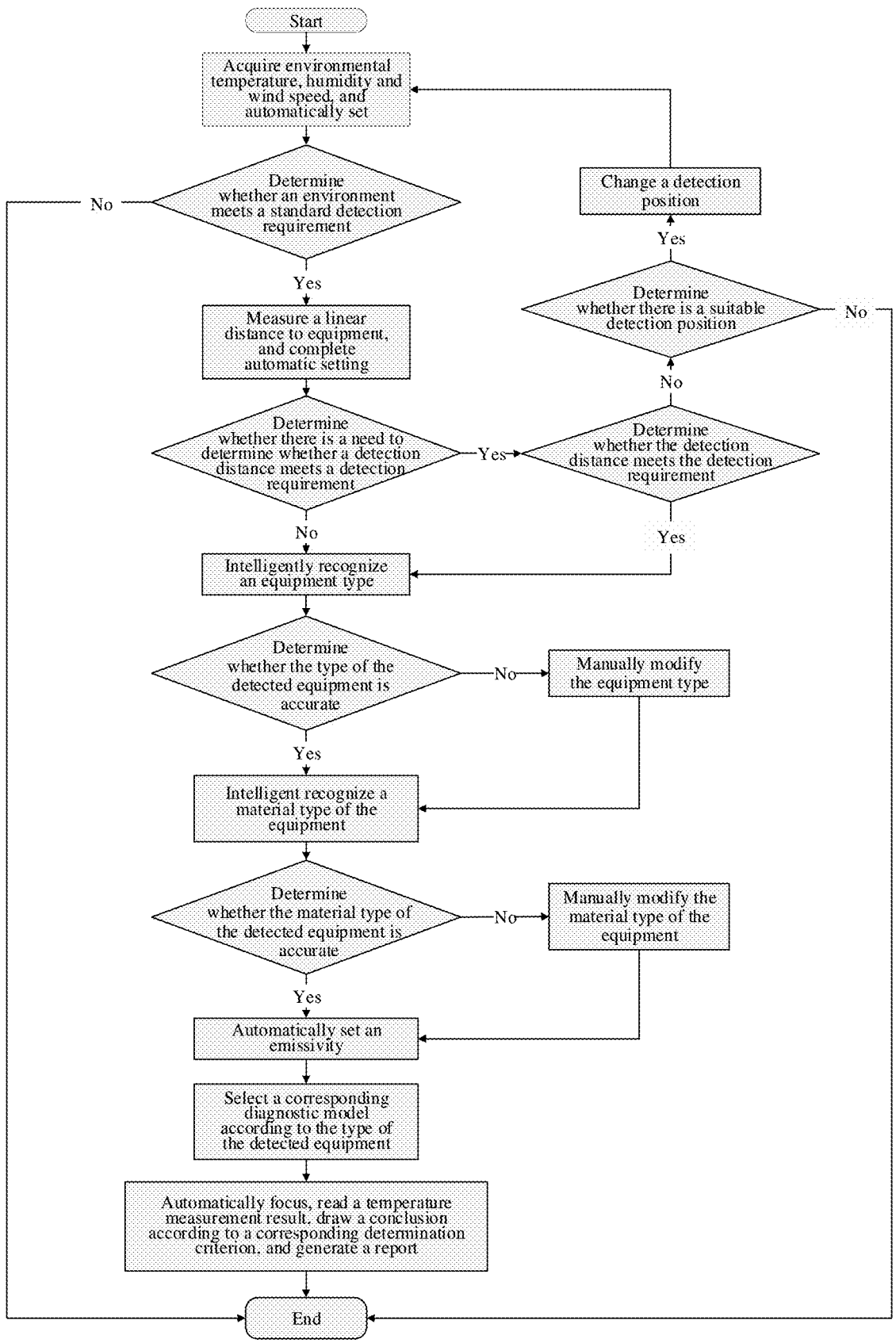
FIG. 3 is a flowchart of live detection of power grid equipment by a thermal infrared (IR) imager according to an exemplary embodiment.

FIG. 2 is a flowchart of the live detection method for power grid equipment according to the exemplary embodiment. As shown in FIG. 3, the live detection method for power grid equipment according to the embodiment of the present invention includes the following steps:

Acquire environmental temperature, humidity and wind speed, and set environmental parameters.

Determine whether an environment meets a standard environmental requirement; proceed to the next step if yes, and end the detection if not.

Measure a linear distance d to the equipment, and complete a detection requirement setting.

Determine whether there is a need to determine whether a detection distance meets a detection requirement; determine whether the detection distance meets the detection requirement if yes, and proceed to the next step after the detection requirement is met.

Intelligently recognize an equipment type, and manually adjust if the recognized equipment type is inaccurate.

Determine a material type of the power grid equipment according to the equipment type and an appearance characteristic of the equipment, and manually adjust if the recognized material type is inaccurate.

Set an emissivity according to the material type of the power grid equipment.

Select a corresponding diagnostic model according to the type of the detected equipment.

Automatically focus on positions of the detected equipment which need temperature measurement, read temperature measurement results, perform calculation and draw a conclusion according to a corresponding determination criterion, and generate a report.

According to a possible implementation of the present embodiment, the standard environmental requirement is that a relative humidity of the environment is not greater than 85%.

According to a possible implementation of the present embodiment, the determining whether a detection distance meets a detection requirement includes: compare the detection distance d with a minimum detection distance $d_{min}$ to recognize the detected power grid equipment; if $d \leq d_{min}$, determine that the detection distance meets the detection requirement; otherwise, determine that the detection distance does not meet the detection requirement, and that the detection needs to be restarted by changing the detection position.

According to a possible implementation of the present embodiment, the minimum detection distance $d_{min}$ is calculated according to the following equation:

minimum detection distance $d_{min}$=target length or height/(spatial resolution×number of pixels).

According to a possible implementation of the present embodiment, when the detection position is changed, if there is no suitable detection position (that is, $d>d_{min}$), the detection is ended.

The live detection method in this embodiment performs IR temperature measurement on the power grid equipment. The live detection method reduces the number of equipment carried by the IR detection personnel, and realizes automatic setting of detection parameters, intelligent recognition of the equipment type, and automatic generation of the detection conclusion, reducing the requirements for the professional level of the detection personnel.

Embodiment 3

A live detection thermal IR imager for power grid equipment according to the embodiment of the present invention includes the live detection system for power grid equipment according to Embodiment 1.

According to a possible implementation of the present embodiment, the ranging module is a ranging module that comes with the thermal IR imager to measure a linear distance d between the thermal IR imager and the power grid equipment, automatically set a detection distance, and determine whether the detection distance meets a detection requirement. The determination on whether the detection distance meets a detection requirement includes: calculate a minimum detection distance $d_{min}$ to recognize the detected equipment according to a minimum recognition length of the detected equipment and a spatial resolution of the thermal IR imager; compare the minimum detection distance with a measured distance d; and prompt that the detection distance does not meet the detection requirement if $d>d_{min}$.

According to a possible implementation of the present embodiment, the thermal IR imager is used to intelligently recognize an equipment type, and manually adjust if the recognized equipment type is inaccurate; determine a material type of the power grid equipment according to the equipment type and an appearance characteristic of the equipment, and manually adjust if the recognized material type is inaccurate; set an emissivity according to the material type of the power grid equipment; select a corresponding diagnostic model according to the type of the detected equipment; automatically focus on positions of the detected equipment which need temperature measurement, read temperature measurement results, perform calculation and draw a conclusion according to a corresponding determination criterion, and generate a report.

At present, on-site personnel needs to carry a ranging instrument to the site to measure the detection distance, and whether the detection distance meets the requirement requires manual calculation. The thermal IR imager of the present invention can automatically determine whether the detection distance meets the detection requirement, and provide a prompt, avoiding the need for a rangefinder and manual calculation.

The thermal IR imager has the following functions:

(1) Automatic Setting of Environmental Parameters

The thermal IR imager acquires environmental temperature, humidity and wind speed through built-in or external sensors. The acquired data are transmitted to a host of the thermal imager, and displayed on a display screen of the thermal imager for automatic setting. If the environmental condition does not meet the requirement of a relevant standard, for example, the standard requires that the relative humidity of the on-site detection environment not be greater than 85%, but the actual relative humidity of the on-site environment reaches 90%, a prompt will be given on the display screen.

(2) Automatic Setting of Detection Distance

The thermal IR imager comes with a ranging function. It can be aimed at the detected equipment to automatically detect the linear distance d from the equipment. The detected distance will be displayed on the display screen of the thermal imager and be automatically set.

Overhead line equipment is located in areas with complex terrain, and some areas are difficult for people to reach. For example, for a power tower in the center of a river or lake, if the detection distance is too large, it will be difficult to recognize the detected equipment. In view of this, the present invention adds an optional functional module for determining whether the detection distance meets a detection requirement. When the detected equipment has a high precision requirement, the minimum recognition length of the detected equipment is manually entered into the thermal imager. The thermal imager calculates the minimum detection distance $d_{min}$ to recognize the detected equipment according to its spatial resolution. The minimum detection distance is then compared with the measured detection distance d. If $d>d_{min}$, the display screen will prompt that the detection distance does not meet the detection requirement, and that the detection personnel needs to adjust the detection position according to the on-site situation.

(3) Intelligent Recognition of Equipment Type

The thermal IR imager system has an image recognition function. It can intelligently recognize the type of the power grid equipment and display the recognized type on the display screen. If the recognition result is inaccurate, the detection personnel can adjust it manually, and the system can learn independently based on the manual adjustment result.

(4) Automatic Setting of Emissivity

The thermal IR imager system can intelligently recognize the type of the equipment material according to the recognized equipment type and the appearance characteristic of the equipment, and display the recognized material type on the display screen. If the recognition result is inaccurate, the detection personnel can adjust it manually, and the system can learn independently based on the manual adjustment result. The thermal imager automatically sets the emissivity based on the equipment material type.

(5) Automatic Temperature Measurement and Conclusion Generation

Different equipment types have different determination methods for IR diagnosis. The thermal IR imager system integrates IR diagnostic models for different types of equipment in accordance with relevant standards. According to the type of the detected equipment, a corresponding diagnostic model is selected, and the position of the detected equipment which needs temperature measurement is automatically focused. The temperature measurement result is read, and the measurement position and temperature value are displayed on the display screen. A calculation is performed and a conclusion is drawn according to a corresponding determination criterion, and a report is generated.

FIG. 3 is a flowchart of live detection of power grid equipment by the thermal IR imager. The thermal IR imager performs IR temperature measurement on the power grid equipment. The thermal IR imager reduces the number of equipment carried by the IR detection personnel, and realizes automatic setting of detection parameters, intelligent recognition of the equipment type, and automatic generation of the detection conclusion, reducing the requirements for the professional level of the detection personnel.

This embodiment automatically detects the environmental temperature, humidity, wind speed, and detection distance from the equipment, automatically recognizes the types of the equipment and material, determines the emissivity, and automatically sets the above parameters in the thermal imager. The thermal IR imager determines the equipment type through image recognition, automatically reads the temperature data of the corresponding position of the equipment according to an IR diagnostic standard corresponding to the equipment type, performs calculation and draws a detection conclusion. The thermal IR imager reduces the number of equipment carried by the IR detection personnel, and realizes automatic setting of detection parameters, intelligent recognition of the equipment type, and automatic generation of the detection conclusion, reducing the requirements for the professional level of the detection personnel.

In the present invention, the environmental parameter module may include one or more sensors and processors. The ranging module may be a rangefinder. The equipment type recognition module may include a camera or a camera device, and a processor if necessary. The equipment material determination module and the emissivity setting module may be independent processors or shared processors. The temperature measurement module may be a temperature measurement sensor or a thermometer. The report generation module includes a processor and a memory. The environmental determination module may be a processor. The ranging module or the self-contained ranging module may be a rangefinder commonly used in the field in the prior art. The IR ranging module may be an IR ranging sensor or an IR rangefinder.

The above described are preferred implementations of the present invention, and for those of ordinary skill in the art, various improvements and modifications may be made without departing from the principles of the present invention. These improvements and modifications should also be regarded as falling into the protection scope of the present invention.

The invention claimed is:

1. A live detection system for power grid equipment, comprising:
an environmental parameter module, configured to acquire environmental temperature, humidity and wind speed data and perform parameter setting;
a ranging module, configured to measure a linear distance to the power grid equipment and perform parameter setting;
an equipment type recognition module, configured to acquire an image of the power grid equipment and recognize a type of the power grid equipment;
an equipment material determination module, configured to determine a material type of the power grid equipment according to the recognized equipment type and an appearance characteristic of the equipment;
an emissivity setting module, configured to set an emissivity according to the material type of the power grid equipment;
a temperature measurement module, configured to obtain a temperature of the power grid equipment by focusing on positions of the power grid equipment which need temperature measurement; and
a report generation module, configured to select a corresponding diagnostic model according to the type of the detected power grid equipment, display a temperature measurement position and a temperature value on a display screen, draw a conclusion according to a corresponding determination criterion, and generate a report.

2. The live detection system for power grid equipment according to claim 1, further comprising an environmental determination module, configured to determine whether the acquired environmental humidity data meets a requirement of environment detection.

3. The live detection system for power grid equipment according to claim 1, wherein the ranging module is an infrared (IR) ranging module.

4. A live detection thermal IR imager for power grid equipment, comprising the live detection system for power grid equipment according to claim 3, wherein the thermal IR imager acquires the environmental temperature, humidity and wind speed data through built-in sensors.

5. The live detection thermal IR imager for power grid equipment according to claim 4, wherein a ranging module is a ranging module that comes with the thermal IR imager to measure a linear distance d between the thermal IR imager and the power grid equipment and determine whether a detection distance meets a detection requirement.

6. The live detection thermal IR imager for power grid equipment according to claim 5, wherein the thermal IR imager is configured to intelligently recognize an equipment type, and allow manual adjustment if the recognized equipment type is inaccurate; determine a material type of the power grid equipment according to the equipment type and an appearance characteristic of the equipment, and allow manual adjustment if the recognized material type is inaccurate; set an emissivity according to the material type of the power grid equipment; select a corresponding diagnostic model according to the type of the detected equipment; automatically focus on positions of the detected equipment which need temperature measurement, read temperature measurement results, performing calculation according to a corresponding determination criterion to draw a conclusion, and generate a report.

7. A live detection method for power grid equipment, comprising following steps:
S1, acquiring environmental temperature, humidity and wind speed, and performing environmental parameter setting;
S2, determining whether an environment meets a standard environmental requirement, proceeding to step S3, if yes, and ending detection if not;
S3, measuring a linear distance d to the equipment, and completing detection requirement setting;
S4, determining whether there is a need to determine whether a detection distance meets a detection requirement; determining whether the detection distance meets the detection requirement if yes, and proceeding to step S5, if the detection requirement is met;
S5, intelligently recognizing an equipment type, and allowing manual adjustment if the recognized equipment type is inaccurate;
S6, determining a material type of the power grid equipment according to the equipment type and an appearance characteristic of the equipment, and allowing manual adjustment if the recognized material type is inaccurate;
S7, setting an emissivity according to the material type of the power grid equipment;
S8, selecting a corresponding diagnostic model according to the type of the detected equipment; and
S9, automatically focusing on positions of the detected equipment which need temperature measurement, reading temperature measurement results, performing calculation according to a corresponding determination criterion to draw a conclusion, and generating a report.

8. The live detection method for power grid equipment according to claim 7, wherein the determining whether a detection distance meets a detection requirement comprises: comparing the detection distance d with a minimum detection distance $d_{min}$, which allows recognition of the detected power grid equipment; if $d \leq d_{min}$, determining that the detection distance meets the detection requirement; otherwise, determining that the detection distance does not meet the detection requirement and restarting the detection after changing the detection position.

9. The live detection method for power grid equipment according to claim 8, wherein the minimum detection distance $d_{min}$ is calculated according to an equation:

$$\text{minimum detection distance } d_{min} = \text{target length or height}/(\text{spatial resolution} \times \text{number of pixels}).$$

10. The live detection method for power grid equipment according to claim 8, wherein after changing the detection position, ending detection if there is no suitable detection position.

* * * * *